(12) United States Patent
Lin et al.

(10) Patent No.: US 12,727,198 B2
(45) Date of Patent: Sep. 1, 2026

(54) HIGH FREQUENCY TRANSISTOR

(71) Applicant: Powerchip Semiconductor Manufacturing Corporation, Hsinchu (TW)

(72) Inventors: Hsin-Cheng Lin, Taipei City (TW); Avishek Das, New Taipei City (TW); Kuan-Ying Chiu, Taoyuan City (TW); Chee-Wee Liu, Taipei City (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 713 days.

(21) Appl. No.: 18/153,956

(22) Filed: Jan. 12, 2023

(65) Prior Publication Data

US 2024/0204065 A1 Jun. 20, 2024

(30) Foreign Application Priority Data

Dec. 16, 2022 (TW) ................................ 111148587

(51) Int. Cl.
*H10D 30/67* (2025.01)
*H10D 30/62* (2025.01)
(Continued)

(52) U.S. Cl.
CPC ..... *H10D 30/6729* (2025.01); *H10D 30/6211* (2025.01); *H10D 30/6219* (2025.01);
(Continued)

(58) Field of Classification Search
CPC ............. H10D 64/519; H10D 84/0149; H10D 64/257; H01L 23/5283; H01L 23/485; H10W 20/43; H10W 20/435
See application file for complete search history.

(56) References Cited

U.S. PATENT DOCUMENTS 8,653,564 B1 2/2014 Zhan
8,952,424 B2 2/2015 Herberholz
(Continued)

FOREIGN PATENT DOCUMENTS

TW 201436218 9/2014
TW 201740562 11/2017
(Continued)

OTHER PUBLICATIONS

Wikipedia: Back End of Line https://en.wikipedia.org/w/index.php?title=Back_end_of_line&oldid=1075830314 (Year: 2022).*
(Continued)

*Primary Examiner* — Britt Hanley
*Assistant Examiner* — Jason James Greaving
(74) *Attorney, Agent, or Firm* — JCIPRNET

(57) ABSTRACT

A high frequency transistor includes a substrate, a plurality of gates, a plurality of sources/drains, a first metal layer, a plurality of source/drain contacts, and a plurality of first gate contacts. The gates extend along a first direction on a surface of the substrate, and the sources/drains are disposed in the substrate on both sides of each of the gates. The first metal layer has a first portion extending along the first direction and a second portion extending along a second direction, and the first direction is perpendicular to the second direction. The first portion is a discontinuous line segment having a discontinuous region in the second direction, and the second portion is a continuous line segment passing through the discontinuous region. The source/drain contacts are respectively connected to the first portion and the sources/drains. The first gate contacts are respectively connected to the second portion and the gates.

11 Claims, 9 Drawing Sheets

(51) Int. Cl.
*H10D 62/10* (2025.01)
*H10W 20/41* (2026.01)

(52) U.S. Cl.
CPC ....... *H10D 30/6757* (2025.01); *H10D 62/121* (2025.01); *H10W 20/435* (2026.01)

(56) References Cited

U.S. PATENT DOCUMENTS

| | | | | |
|---|---|---|---|---|
| 2016/0254373 | A1 | 9/2016 | Harrington, III et al. | |
| 2017/0271258 | A1 | 9/2017 | Wood et al. | |
| 2019/0164971 | A1 | 5/2019 | Liaw | |
| 2020/0321458 | A1 | 10/2020 | Fayed et al. | |
| 2022/0359745 | A1 | 11/2022 | Huang et al. | |
| 2023/0009803 | A1* | 1/2023 | Chen | H01L 23/585 |
| 2025/0040456 | A1* | 1/2025 | Williams | H10D 89/10 |

FOREIGN PATENT DOCUMENTS

| | | |
|---|---|---|
| TW | 202042291 | 11/2020 |
| TW | 202114065 | 4/2021 |
| TW | 202121696 | 6/2021 |

OTHER PUBLICATIONS

"Office Action of Taiwan Counterpart Application", issued on Sep. 4, 2023, p. 1-p. 5.

* cited by examiner

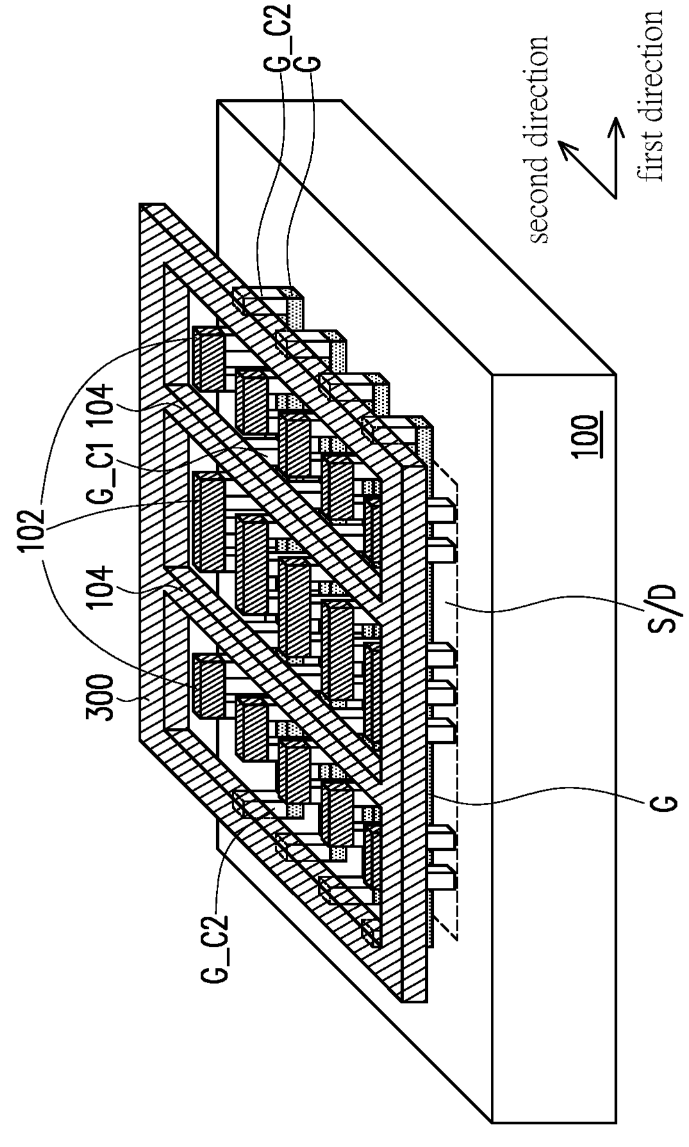
FIG. 3
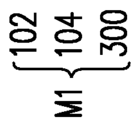

M1 { 102, 104, 400, 402

BEOL {M2, V1, M3, V2}

M1 {102, 104, 300}

HIGH FREQUENCY TRANSISTOR

CROSS-REFERENCE TO RELATED APPLICATION

This application claims the priority benefit of Taiwan application serial no. 111148587, filed on Dec. 16, 2022. The entirety of the above-mentioned patent application is hereby incorporated by reference herein and made a part of this specification.

BACKGROUND

Technical Field

The disclosure relates to a semiconductor transistor, and particularly relates to a high frequency transistor.

Description of Related Art

In terms of layout, the current transistors usually connect the gate by one-sided gate contact, which however results in high gate resistance ($R_g$). When the transistors are used in high frequency components, high $R_g$ may lead to a decrease in the maximum oscillation frequency ($f_{MAX}$), as shown in the following formula (1).

$$f_{MAX} = \frac{F_T}{2\sqrt{2\pi f_T C_{gd}(R_g + R_s) + (R_g + R_s)g_d}} \quad (1)$$

$R_s$ in the formula (1) represents the source resistance, $C_{gd}$ represents the gate-drain capacitance, $g_d$ represents the output conductance, and $f_T$ is the following formula (2).

$$f_T = \frac{g_m}{2\pi C_{gg}} = \frac{g_m}{2\pi(C_{ox} + C_{par})} \quad (2)$$

$C_{par}$ in the formula (2) represents the parasitic capacitance, $g_m$ represents the transconductance, $C_{gg}$ represents the gate capacitance (here, it represents the total capacitance of the gate), and $C_{ox}$ represents the gate oxide layer capacitance.

Therefore, double-sided gate contact is adopted to reduce the gate resistance. However, this approach may still cause the gate resistance to increase as the length of the device active area increases.

In addition, improved back-end-of-the-line (BEOL) metal interconnect may be used to directly connect the gate in the active area so as to reduce the gate resistance. However, since the distance between the metal layers connecting the gate in the active area is very small, the parasitic capacitance from the gate to the source/drain increases and results in greater $C_{gg}$, which is not suitable for high frequency applications.

SUMMARY

The disclosure provides a high frequency transistor, which reduces the gate resistance ($R_g$) and also has low parasitic capacitance ($C_{par}$).

The high frequency transistor according to an embodiment of the disclosure includes a substrate, a plurality of gates, a plurality of sources/drains, a first metal layer (M1), a plurality of source/drain contacts, and a plurality of first gate contacts. The gates extend along a first direction on a surface of the substrate, and the sources/drains are disposed in the substrate on both sides of each of the gates. The first metal layer has a first portion extending along the first direction and a second portion extending along a second direction, and the first direction is perpendicular to the second direction. The first portion is a discontinuous line segment having a discontinuous region in the second direction, and the second portion is a continuous line segment passing through the discontinuous region. The source/drain contacts are respectively connected to the first portion and the sources/drains. The first gate contacts are respectively connected to the second portion and the gates.

In an embodiment of the disclosure, the first metal layer further includes an annular portion surrounding the gates and directly contacting both ends of the second portion.

In an embodiment of the disclosure, the high frequency transistor further includes a plurality of second gate contacts respectively connecting the annular portion to both ends of each of the gates.

In an embodiment of the disclosure, the number of the continuous line segments of the second portion is 1 or more.

In an embodiment of the disclosure, the high frequency transistor further includes a back-end-of-the-line (BEOL) metal interconnect disposed above the first metal layer.

In an embodiment of the disclosure, the number of layers of the BEOL metal interconnect is 6 or less.

In an embodiment of the disclosure, a material of the BEOL metal interconnect includes platinum, titanium, titanium nitride, aluminum, tungsten, tungsten nitride, ruthenium, ruthenium oxide, tantalum, nickel, cobalt, copper, silver or gold.

In an embodiment of the disclosure, a type of the high frequency transistor includes planar MOSFET, FinFET, nanosheet transistor or nanowire field effect transistor.

In an embodiment of the disclosure, the number of the gates, calculated along the second direction, is 50 per micron or less.

In an embodiment of the disclosure, the number of the discontinuous regions of the first portion, calculated along the first direction, is 50 per micron or less.

In an embodiment of the disclosure, a length of each of the gates is 20 nm to 200 μm, and a width of each of the gates is 10 nm to 500 nm.

In an embodiment of the disclosure, a length of the first portion is 20 nm to 200 μm, and a width of the first portion is 10 nm to 500 nm.

In an embodiment of the disclosure, a distance between the continuous line segment and the discontinuous line segment in the discontinuous region is 5 nm to 5 μm.

In an embodiment of the disclosure, an active area is defined in the substrate.

In an embodiment of the disclosure, a length of the active area is 20 nm to 200 μm, and a width of the active area is 20 nm to 200 μm.

Based on the above, the high frequency transistor according to the disclosure has a novel array layout, so that the first portion of the metal layer electrically connected to the sources/drains and the second portion of the metal layer electrically connected to the gates are vertically distributed. Moreover, the second portion of the metal layer passes above the active area, which realizes low parasitic capacitance and low gate resistance for high frequency applications.

In order to make the above-mentioned and other features and advantages of the disclosure more comprehensible, exemplary embodiments are described in detail hereinafter with reference to the accompanying drawings.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 3 is a perspective view of a high frequency transistor according to the second embodiment.

DETAILED DESCRIPTION OF DISCLOSED EMBODIMENTS

Figure 1:
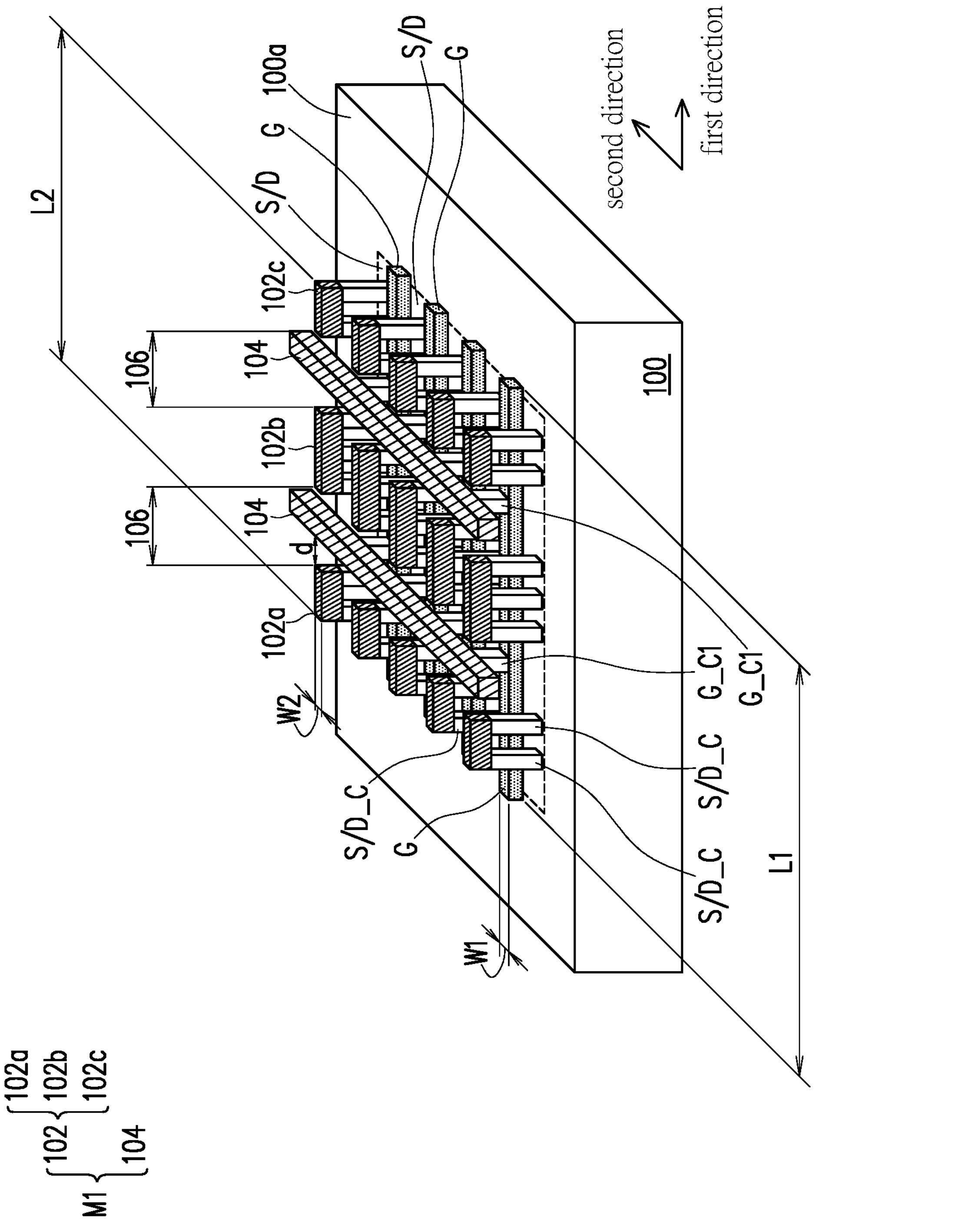
FIG. 1 is a perspective view of a high frequency transistor according to the first embodiment of the disclosure.

Several embodiments for implementing different features of the disclosure are provided hereinafter. Nevertheless, these embodiments are exemplary and are not intended to limit the scope and application of the disclosure. The relative sizes (for example, length, thickness, spacing, etc.) and relative positions of regions or structural components may be reduced or exaggerated for clarity. Additionally, similar or identical reference numerals shown in different drawings denote similar or identical components or features.

Figure 2:
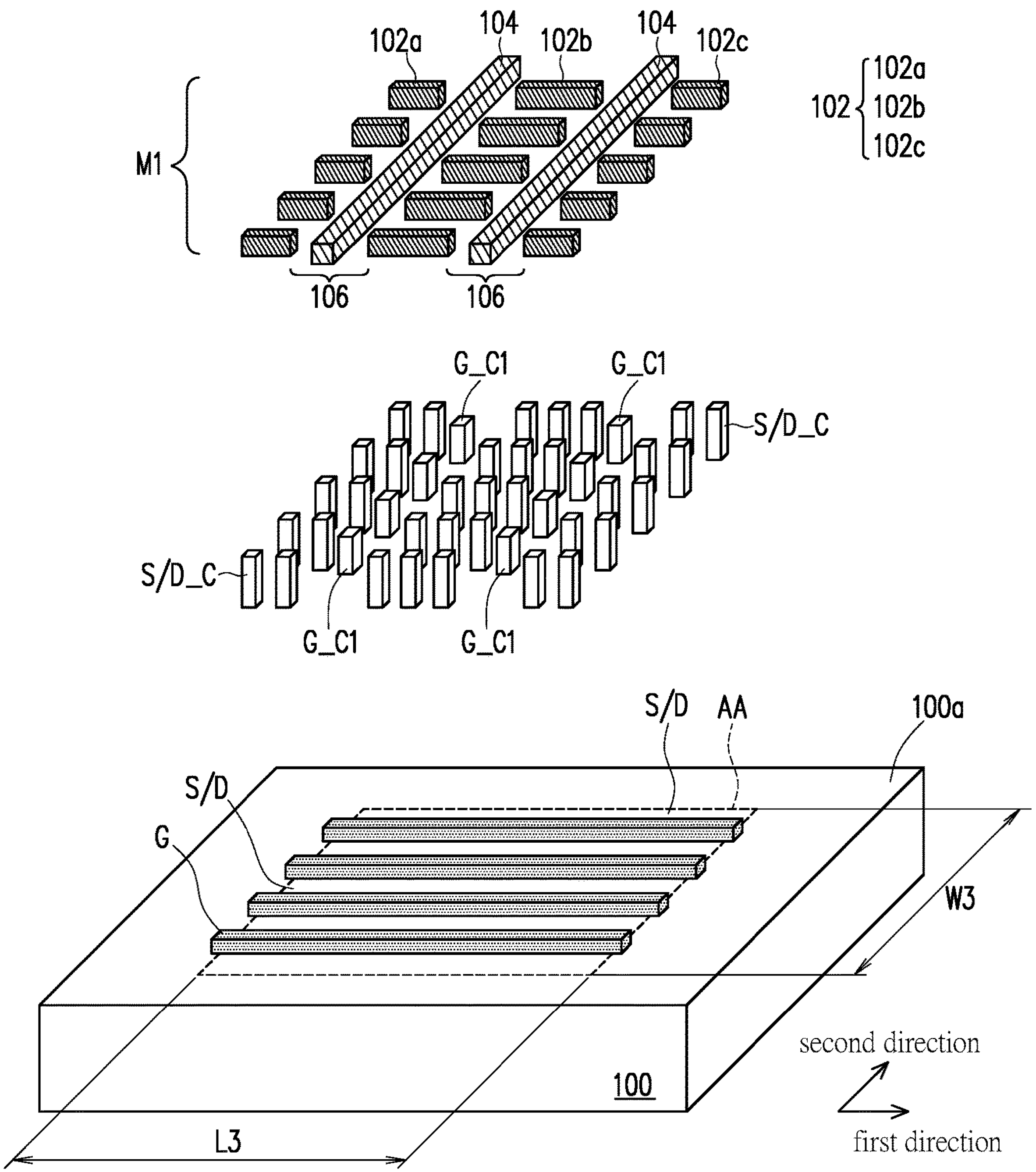
FIG. 2 is an exploded view of the high frequency transistor in FIG. 1.

FIG. 1 is a perspective view of a high frequency transistor according to the first embodiment of the disclosure. FIG. 2 is an exploded view of the high frequency transistor in FIG. 1.

Referring to FIG. 1 and FIG. 2, the high frequency transistor of the first embodiment includes a substrate 100, a plurality of gates G, a plurality of sources/drains S/D, a first metal layer M1, a plurality of source/drain contacts S/D_C, and a plurality of gate contacts G_C1. The gates G extend along the first direction on a surface 100*a* of the substrate 100. Although FIG. 1 shows only four gates G, the disclosure is not limited thereto. In an embodiment, the number of gates G, calculated along the second direction, may be 50 per micron or less, for example, 50, 40, 30, and so on. The length L1 of each gate G is, for example, 20 nm to 200 μm, and the width W1 of each gate G is, for example, 10 nm to 500 nm. The sources/drains S/D are disposed in the substrate 100 on both sides of each gate G.

In FIG. 1, the first metal layer M1 has a first portion 102 extending along the first direction and a second portion 104 extending along the second direction, and the first direction is perpendicular to the second direction. The first portion 102 includes discontinuous line segments 102*a*, 102*b*, and 102*c* having a discontinuous region 106 in the second direction, and the second portion 104 is a continuous line segment passing through the discontinuous region 106. In this embodiment, the number of continuous line segments of the second portion 104 is 2, but the disclosure is not limited thereto. In other embodiments, the number of continuous line segments of the second portion 104 is 1 or more, depending on the size of the high frequency transistor. Similarly, the first portion 102 in FIG. 1 has two discontinuous regions 106, but the disclosure is not limited thereto. In an embodiment, the number of discontinuous regions 106 of the first portion 102, calculated along the first direction, may be 50 per micron or less, for example, 50, 40, 30, and so on. The length L2 of the first portion 102 is, for example, 20 nm to 200 μm, and the width W2 of the first portion 102 is, for example, 10 nm to 500 nm.

Also referring to FIG. 1 and FIG. 2, the source/drain contacts S/D_C are respectively connected to the first portion 102 and the sources/drains S/D, and the first gate contacts G_C1 are respectively connected to the second portion 104 and the gates G. Since the second portions 104 connected to the gates G are separated by a distance, generation of parasitic capacitance can be prevented or kept very small. Moreover, the second portion 104 is directly connected to the gate G through the first gate contact G_C1 in the active area AA, so the gate resistance is also very small. In addition, because the extending directions of the first portion 102 and the second portion 104 are different, there is a relatively large margin for layout. For example, the distance d between the continuous line segment in the discontinuous region 106 (that is, the second portion 104) and the discontinuous line segment 102*a* may be 5 nm to 5 μm. The area indicated by the dotted line in FIG. 2 is the active area AA defined in the substrate 100, and the sources/drains S/D are formed in the active area AA on both sides of the gates G. In an embodiment, the length L3 of the active area AA is, for example, 20 nm to 200 μm, and the width W3 of the active area AA is, for example, 20 nm to 200 μm. In this embodiment, in addition to the planar MOSFET shown in FIG. 1, the type of the high frequency transistor may also be FinFET, nanosheet transistor or nanowire field effect transistor.

FIG. 3 is a perspective view of a high frequency transistor according to the second embodiment, wherein the same or similar parts and components are denoted by the same reference numerals as those in the first embodiment, and details of the same or similar parts and components can be found in the descriptions of the first embodiment and will not be repeated here.

In FIG. 3, in addition to the structure of the first embodiment, the first metal layer M1 further includes an annular portion 300 surrounding the gates G and directly contacting both ends of the second portion 104. The length of the gate G beyond the active area AA may be longer than that of the gate G in the first embodiment. In addition, a plurality of second gate contacts G_C2 are disposed at both ends of each gate G to connect the annular portion 300 to both ends of each gate G. Therefore, the current distribution of the gate G is more uniform, which further reduces the gate resistance.

Figure 4:
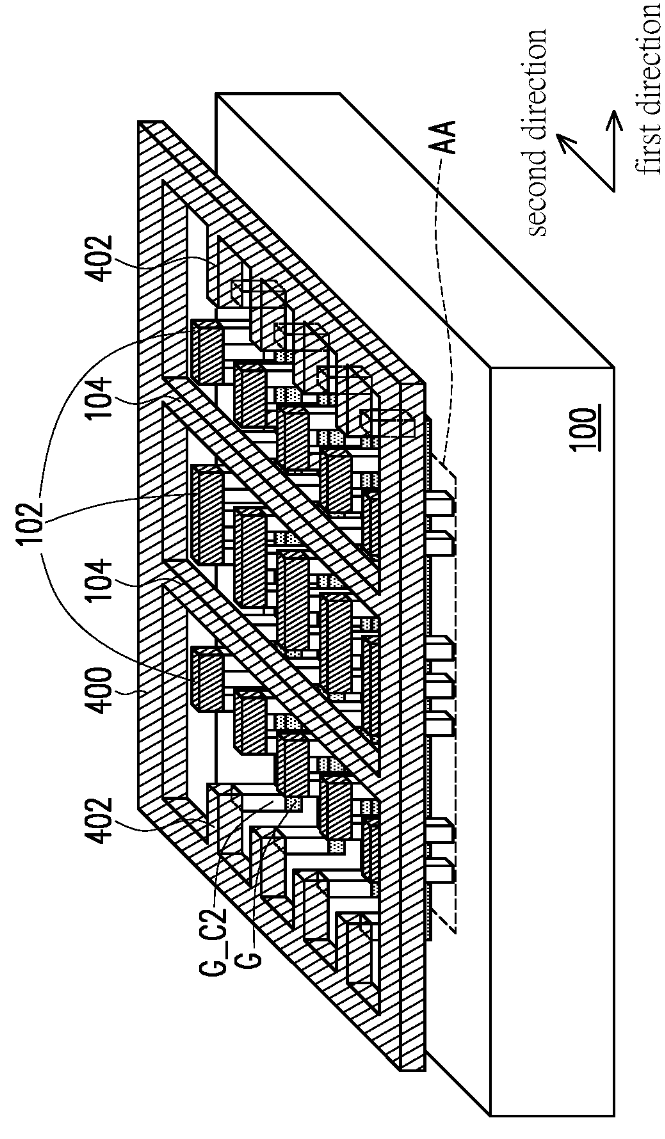
FIG. 4 is a perspective view of a high frequency transistor according to the third embodiment.

FIG. 4 is a perspective view of a high frequency transistor according to the third embodiment, wherein the same or similar parts and components are denoted by the same reference numerals as those in the second embodiment, and details of the same or similar parts and components can be found in the descriptions of the second embodiment and will not be repeated here.

In FIG. 4, the annular portion 400 of the first metal layer M1 is relatively large and has extensions 402, and the extensions 402 overlap both ends of the gate G in a plan view. Further, the second gate contacts G_C2 respectively connect the extensions 402 of the annular portion 400 to both ends of each gate G.

Figure 5:
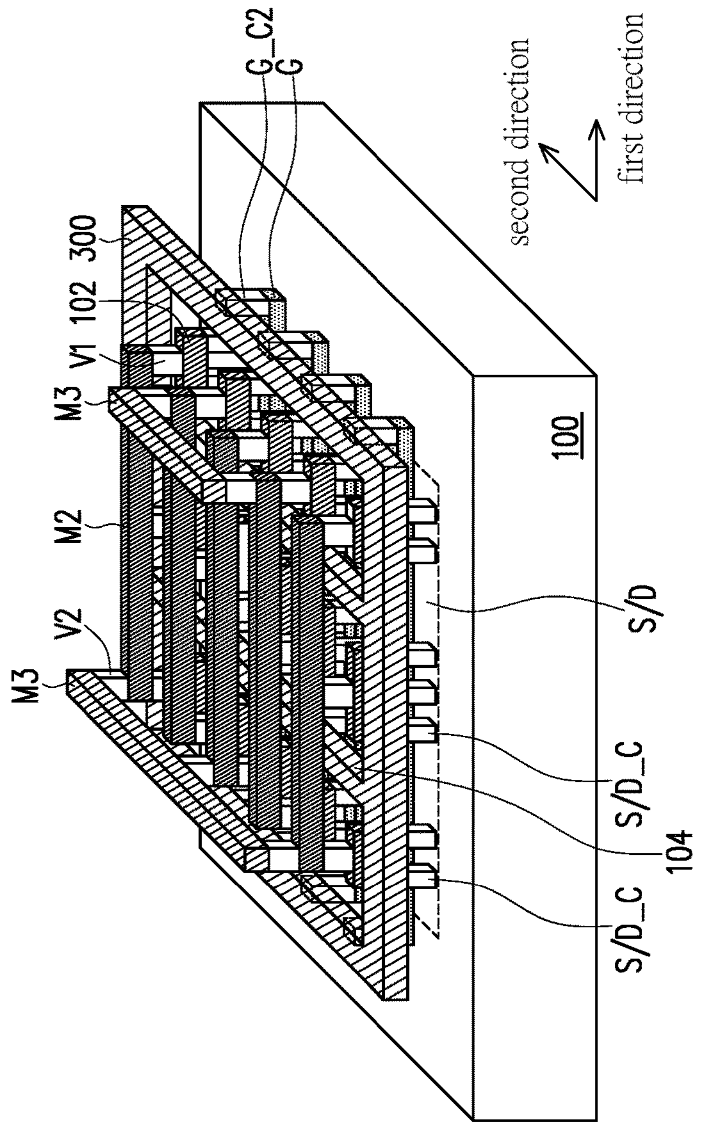
FIG. 5 is a perspective view of a high frequency transistor according to the fourth embodiment.

FIG. 5 is a perspective view of a high frequency transistor according to the fourth embodiment, wherein the same or similar parts and components are denoted by the same reference numerals as those in the second embodiment, and details of the same or similar parts and components can be found in the descriptions of the second embodiment and will not be repeated here.

In FIG. 5, in addition to the structure of the second embodiment, the high frequency transistor also includes a BEOL metal interconnect BEOL disposed above the first metal layer M1. In this embodiment, the number of layers of the BEOL metal interconnect BEOL is 3 or less, such as a second metal layer M2, a third metal layer M3, and vias V1 and V2 between the aforementioned metal layers. However, the disclosure is not limited thereto. In another embodiment, the number of layers of the BEOL metal interconnect BEOL may be 6 or less. The via V1 connects the discontinuous line segment of the first portion 102, the via V2 connects the second metal layer M2 and the third metal layer M3, and one third metal layer M3 may be connected to one of the source/drain S/D (for example, source) and another third metal layer M3 may be connected to the other one of the source/drain S/D (for example, drain). However, the disclosure is not limited thereto, and the BEOL metal interconnect BEOL above the first metal layer M1 may also have other designs, for example, having 4 or more metal layers. In an embodiment, the material of the BEOL metal interconnect BEOL includes platinum, titanium, titanium nitride, aluminum, tungsten, tungsten nitride, ruthenium, ruthenium oxide, tantalum, nickel, cobalt, copper, silver or gold.

FIG. 6A to FIG. 6D are views showing a manufacturing process of a high frequency transistor according to the fifth embodiment of the disclosure.

Figure 6A:
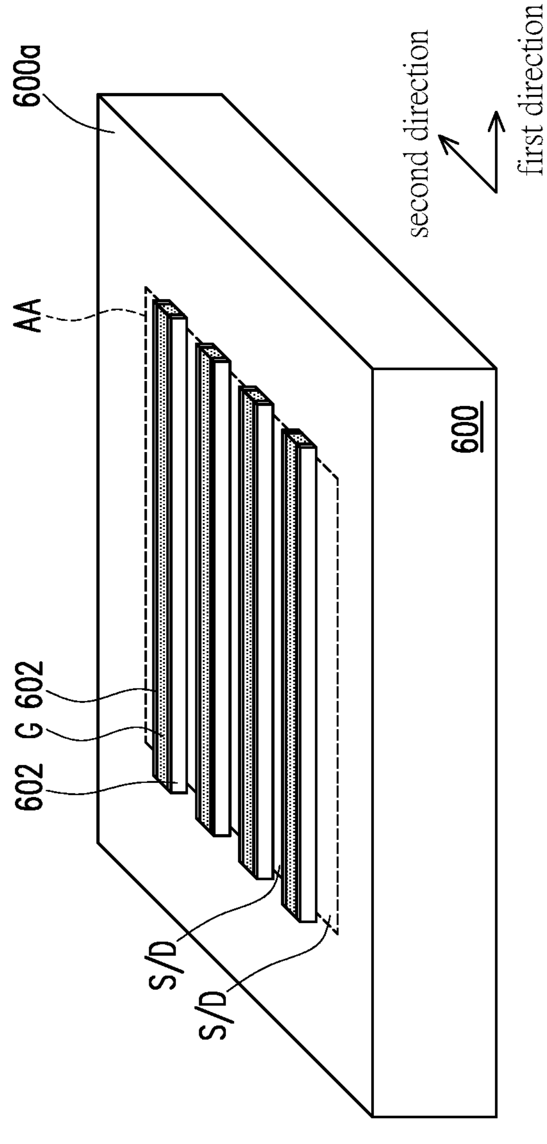
FIG. 6A to FIG. 6D are views showing a manufacturing process of a high frequency transistor according to the fifth embodiment of the disclosure.

Referring to FIG. 6A, an active area AA is defined in a substrate 600. For example, an element isolation structure (for example, STI) is formed in the substrate 600 to surround the active area AA. Then, a plurality of gates G extending along the first direction are formed on a surface 600*a* of the substrate 600, and spacers 602 are formed on sidewalls of the gates G. Subsequently, sources/drains S/D are formed in the active area AA, and the formed sources/drains S/D are located in the active area AA on both sides of the gates G.

Figure 6B:
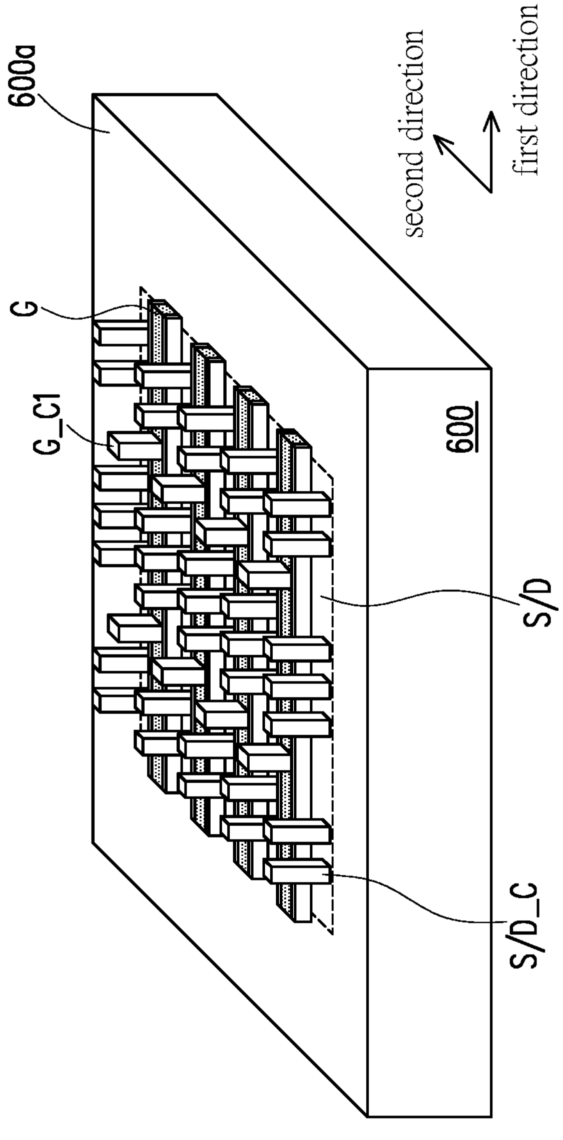

Then, referring to FIG. 6B, source/drain contacts S/D_C are formed on the sources/drains S/D, and first gate contacts G_C1 are formed on the gates G. The source/drain contacts S/D_C and the first gate contacts G_C1 may be manufactured simultaneously or separately. Although FIG. 6B only shows the source/drain contacts S/D_C and the first gate contacts G_C1, it should be known that the manufacturing process includes forming a dielectric layer (not shown) on the surface 600*a* of the substrate 600, forming a plurality of openings in the dielectric layer to expose the sources/drains S/D and the gates G underneath, and then forming the source/drain contacts S/D_C and the first gate contacts G_C1 in the openings.

Figure 6C:
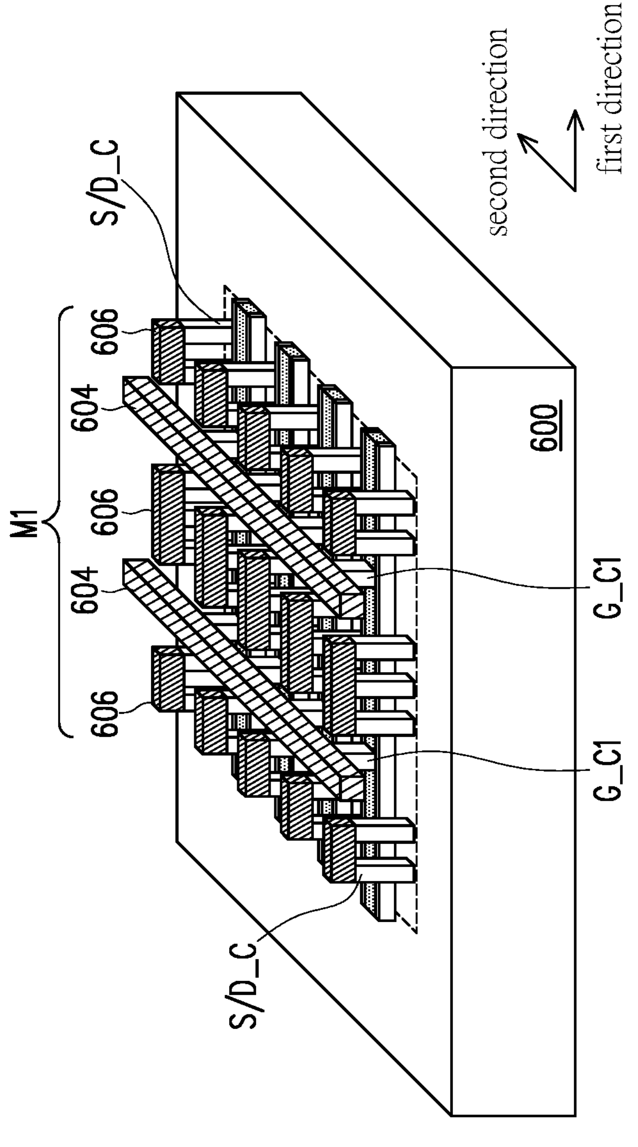

Next, referring to FIG. 6C, a first metal layer M1 is formed. The first metal layer M1 is composed of continuous line segments 604 and discontinuous line segments 606. The discontinuous line segment 606 extends along the first direction and connects the first gate contacts G_C1, and the continuous line segment 604 extends along the second direction and connects the source/drain contacts S/D_C. The detailed structure of the first metal layer M1 can be understood by referring to the above embodiments, one form of which is shown in FIG. 6C.

Figure 6D:
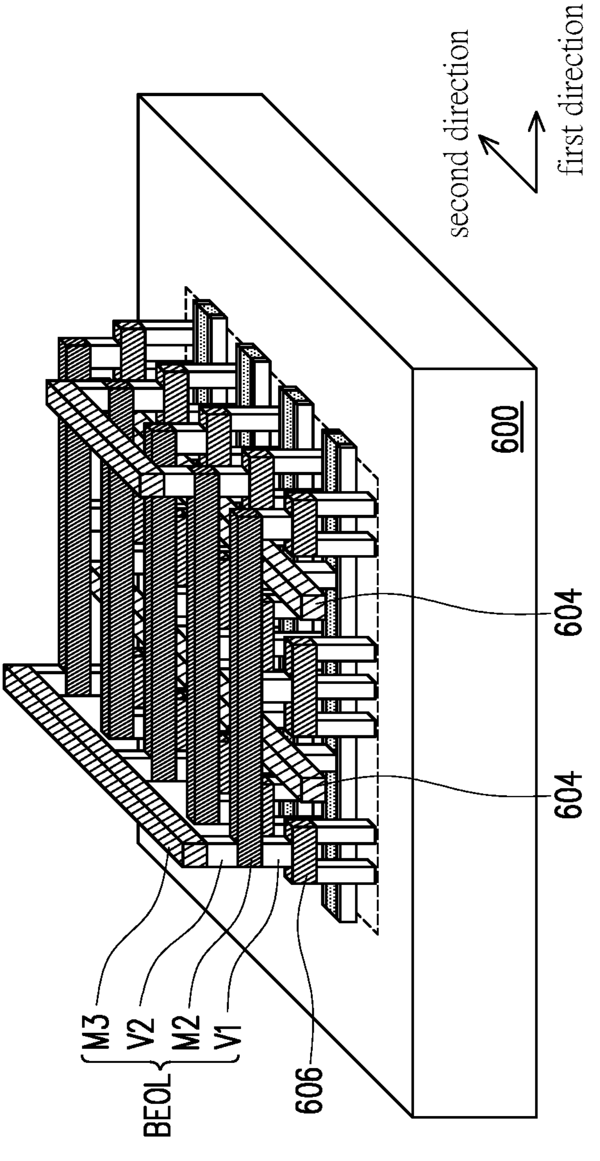
Figure 6D:
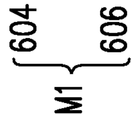

Then, referring to FIG. 6D, a BEOL metal interconnect BEOL may be formed on the first metal layer M1. The BEOL metal interconnect BEOL may be formed by an existing BEOL process to have the second metal layer M2, the third metal layer M3, and the vias V1 and V2 between the aforementioned metal layers, as shown in the figure. However, the disclosure is not limited thereto.

Except for the necessary steps, some steps may be omitted or added according to the requirements, and the used processes and methods may also be replaced with the existing technologies and are not limited to the above content.

Although the disclosure has been described with reference to the embodiments above, they are not intended to limit the disclosure. Those skilled in the art may make changes and modifications without departing from the spirit and scope of the disclosure. Therefore, the scope of protection of the disclosure should be defined by the following claims.

What is claimed is:

1. A high frequency transistor, comprising:

a substrate, comprising an active area defined in the substrate;

a plurality of gates extending along a first direction on a surface of the single active area of the substrate;

a plurality of sources/drains disposed in the single active area on both sides of each of the gates;

a first metal layer comprising discontinuous line segments over the sources/drains along the first direction and continuous line segments configured over the gates extending along a second direction, wherein the first direction is perpendicular to the second direction, and a plurality of discontinuous regions extends in the second direction, wherein each discontinuous region is configured between a pair of the discontinuous line segments, and the continuous line segment passes through the discontinuous region;

a plurality of source/drain contacts respectively connected to the discontinuous line segments and the plurality of sources/drains in the single active area, wherein the discontinuous line segments arranged in the first direction are coupled to the same sources/drain; and a plurality of first gate contacts respectively connected to each of the continuous line segments of the each of the second portions and the gates.

2. The high frequency transistor according to claim 1, further comprising a back-end-of-the-line (BEOL) metal interconnect disposed above the first metal layer.

3. The high frequency transistor according to claim 2, wherein the number of layers of the BEOL metal interconnect is 6 or less.

4. The high frequency transistor according to claim 2, wherein a material of the BEOL metal interconnect comprises platinum, titanium, titanium nitride, aluminum, tungsten, tungsten nitride, ruthenium, ruthenium oxide, tantalum, nickel, cobalt, copper, silver or gold.

5. The high frequency transistor according to claim 1, wherein a type of the high frequency transistor comprises planar MOSFET, FinFET, nanosheet transistor or nanowire field effect transistor.

6. The high frequency transistor according to claim 1, wherein the number of the gates, calculated along the second direction, is 50 per micron or less.

7. The high frequency transistor according to claim 1, wherein the number of the discontinuous regions, calculated along the first direction, is 50 per micron or less.

8. The high frequency transistor according to claim 1, wherein a length of each of the gates is 20 nm to 200 μm, and a width of each of the gates is 10 nm to 500 nm.

9. The high frequency transistor according to claim 1, wherein a length of the discontinuous line segments along the first direction is 20 nm to 200 μm, and a width of the discontinuous line segments along the second direction is 10 nm to 500 nm.

10. The high frequency transistor according to claim 1, wherein a distance between the continuous line segment in the discontinuous region and the discontinuous line segment is 5 nm to 5 μm.

11. The high frequency transistor according to claim 1, wherein a length of the active area is 20 nm to 200 μm, and a width of the active area is 20 nm to 200 μm.

* * * * *